US008878790B2

(12) United States Patent
Abele

(10) Patent No.: US 8,878,790 B2
(45) Date of Patent: Nov. 4, 2014

(54) MICROELECTRONIC PRESSURE SENSOR

(75) Inventor: Nicolas Abele, Paris (FR)

(73) Assignee: STMicroelectronics S.A., Montrouge (FR)

(*) Notice: Subject to any disclaimer, the term of this patent is extended or adjusted under 35 U.S.C. 154(b) by 1326 days.

(21) Appl. No.: 12/170,849

(22) Filed: Jul. 10, 2008

(65) Prior Publication Data

US 2009/0027352 A1 Jan. 29, 2009

(30) Foreign Application Priority Data

Jul. 12, 2007 (FR) ...................................... 07 05068

(51) Int. Cl.
*G06F 3/041* (2006.01)
*G06K 9/00* (2006.01)
(52) U.S. Cl.
CPC .................................... *G06K 9/0002* (2013.01)
USPC ................... 345/173; 257/254; 257/E29.324; 257/415
(58) Field of Classification Search
CPC .......... H01L 29/82; H01L 29/84; F01L 7/08; G06F 3/041
USPC ............................ 345/173; 257/254, E29.324
See application file for complete search history.

(56) References Cited

U.S. PATENT DOCUMENTS

| | | | | |
|---|---|---|---|---|
| 4,429,413 A * | 1/1984 | Edwards | ........................ | 382/124 |
| 4,488,162 A * | 12/1984 | Jambotkar | ..................... | 257/398 |
| 4,894,698 A * | 1/1990 | Hijikigawa et al. | ........... | 257/254 |
| 5,400,662 A | 3/1995 | Tamori | | |
| 5,600,459 A * | 2/1997 | Roy et al. | ......................... | 349/42 |
| 6,122,394 A | 9/2000 | Neukermans et al. | | |
| 6,154,580 A | 11/2000 | Kuriyama et al. | | |
| 6,169,316 B1 * | 1/2001 | Sakai et al. | ..................... | 257/419 |
| 6,317,508 B1 | 11/2001 | Kramer et al. | | |
| 6,388,299 B1 * | 5/2002 | Kang et al. | ..................... | 257/415 |
| 7,304,358 B2 | 12/2007 | Ancey et al. | | |
| 7,515,252 B2 | 4/2009 | Hernandez | | |
| 2002/0130341 A1 * | 9/2002 | Horiguchi et al. | ............. | 257/296 |
| 2004/0049363 A1 * | 3/2004 | Shimizu et al. | ................ | 702/139 |
| 2005/0227428 A1 * | 10/2005 | Mihai et al. | ................... | 438/222 |

FOREIGN PATENT DOCUMENTS

| | | |
|---|---|---|
| EP | 0 919 947 A2 | 6/1999 |
| EP | 1 187 207 B1 | 7/2008 |
| GB | 2 407 387 A | 4/2005 |
| WO | 03078299 A1 | 9/2003 |

OTHER PUBLICATIONS

Dobrescu et al., "Modeling the Suspended Gate Mosfet Used as Voltage Programmable Switch," IEEE 1:209-212, Sep. 28, 2003.
Sato et al., "MEMS Fingerprint Sensor Immune to Various Finger Surface Conditions," IEEE Transactions on Electron Devices, 50(4):1109-1116, Apr. 2003.
Gates et al., "Environmental Performance of Sealed Chip-On-Board (SCOB) Memory Circuits," *Proceedings of the 1994 International Conference on Multichip Modules*, Apr. 13-15, 1994, pp. 443-448.

\* cited by examiner

*Primary Examiner* — Srilakshmi K Kumar
*Assistant Examiner* — Sosina Abebe
(74) *Attorney, Agent, or Firm* — Seed IP Law Group PLLC

(57) ABSTRACT

A microelectronic pressure sensor comprises a MOSFET transistor adapted with a mobile gate and a cavity between the mobile gate and a substrate. The sensor includes a gate actuator configured to move mobile gate in response to a pressure being exercised. A fingerprint recognition system includes a matrix of such sensors.

26 Claims, 6 Drawing Sheets

MICROELECTRONIC PRESSURE SENSOR

CROSS-REFERENCE TO RELATED APPLICATION

This application claims the benefit under 35 U.S.C. §119 (a) of French Patent Application No. FR 07 05068, which is incorporated herein by reference in its entirety.

BACKGROUND

1. Technical Field

The present invention relates to a microelectronic pressure sensor allowing the capture of the profile of a surface when said surface is applied on the sensor. The invention is particularly useful for the fingerprint recognition.

2. Description of the Related Art

Classically, a fingerprint sensor operates on the basis of a capacitive measurement. The finger is applied on a substantially planar surface which comprises a high number of first electrodes of different capacitances. The finger, being electrically conductive, embodies a second electrode which is common to all those capacitances. The planar surface is covered by an electrical isolator. The distance separating the second electrodes (i.e., the finger) and the first electrodes is not constant and varies according to the rugosity of the finger. The values of the capacitances being measured are then representative of a fingerprint profile, and thus characterizes the fingerprint.

In order to reduce the number of the capacitors, it has been suggested to scan the asperity of the finger by means of a series of capacitive elements. Such a device is described in U.S. Pat. No. 6,317,508.

The measurement of one capacitor shows to be a delicate operation to achieve, requiring a complex measurement device. Furthermore, the accuracy of such measurement closely depends on the electrostatic environment of the sensor since the electrical circuits therewith associated have to measure very low currents flowing through high impedance circuits. The conductivity of the finger or the pollution on the surface of the sensor might spoil the measurement of the capacity being associated with the profile of the finger.

In the background art, there is already known the use of MOSFET transistors fitted with a mobile gate. Patent application WO 03/078299 and U.S. Pat. No. 7,304,358 describe two distinctive embodiments of such a transistor. As known by a skilled man, a MOSFET transistor is created by means of a known technique. There is then substituted during the manufacturing process of the MOS transistor, at least locally, one sacrificial layer to the gate oxide existing between the substrate and the mobile gate of the MOS Transistor. At the end of the process, the withdrawal of the sacrificial layer, with that of the possible layers already laid on the gate causes the creation of a mobile gate with respect to the substrate located below.

The skilled man is aware of diverse processes for realizing such a transistor and the various possibilities for carrying out a mobile gate. Patent application WO 03/078299 and U.S. Pat. No. 7,304,358 disclose an overhanging gate and a gate which can be distorted (by bending), which are two particular examples of a mobile gate. Those manufacturing processes can be made compatible with the standard MOS manufacturing techniques used for the creation of MOS circuits. Mobile gate transistors can be realized in an integrated circuit which further includes functions which are embodied by MOS transistors having each a standard non-mobile gate. However, the mobile gates show to be very fragile and small elements and are never set in a mechanical interaction with elements being exterior of the integrated circuit. Such interaction would irreversibly destroy the gate or would result in the chemical pollution of the MOSFET transistors, eventually spoiling them.

BRIEF SUMMARY

It is desirable to achieve a sensor having more extended functions than those provided by prior art devices. One embodiment provides a microelectronic pressure sensor for the measurement of the rugosity of one given surface. The measurement is not closely dependent on the electrical conductivity of the said surface. The measurement remains independent of the electrostatic charges and of the chemical pollution provided by the surface to be measured.

In accordance with some embodiments, the microelectronic sensor can capture the profile of a surface even in an environment noised by electrical charge or by an electromagnetic pollution.

The speed of the capture of the profile of the surface as well as the spatial resolution may be adjusted in accordance to the number and the dimension of the measuring points of the microelectronic sensor.

In particular, the microelectronic sensor is able to measure the rugosity and profile of a fingerprint surface and particularly is able to capture and recognize the profile of a fingerprint.

One embodiment is a microelectronic pressure sensor located on a substrate, and including a MOSFET transistor fitted with one mobile gate, a cavity between the mobile gate and the substrate, means for measuring the position of said gate and means for moving the mobile gate in response to the application of a pressure.

Preferably, the means for moving the mobile gate comprises a silicone gel which is mechanically in contact with the latter and able to transform any pressure applied on a surface exterior of said gel into a movement of said gate by means of said mechanical contact.

In one embodiment, the gel has a YOUNG modulus inferior than 400 Mpa, and adheres to the mobile gate. Furthermore, the gel is laid on the substrate outside of said cavity.

In one embodiment, the mobile gate is moved by means of a membrane which can be distorted in response to the application of a pressure and the membrane is capable of exerting an electrostatic or a electromagnetism force on said mobile gate, the force varying in accordance with the distance of between said membrane and said mobile gate.

Preferably, the microelectronic sensor is located within one cavity of a closed package, having a top part being closed by an elastic membrane which is tight, conductive and biased with respect to the mobile gates.

One embodiment also provides a process for measuring the profile of the surface of one body, wherein said surface is applied to the surface of a silicone gel or to the surface of a membrane. The gel or the membrane are able to capture the profile of the surface of the body and are further able to reproduce said profile at the level of the mobile gates of the MOSFET transistors by means of the pressure being locally exerted on the surface of said gel or said membrane by the surface of said body.

Preferably, the process is applied to the processing of the fingerprint, thus achieving a process for capturing a fingerprint.

There is also provided a flat display system based on a matrix arranged in rows and columns and comprising display pixels formed at the crossing of each row and each column.

The system further comprises an arrangement of pressure microsensors, each of which being based on a MOSFET transistor having a mobile gate, a cavity located between said mobile gate and the substrate, and means for measuring the position of said mobile gate and means for moving said mobile gate in response to the application of a pressure.

There is also provided a planar display system which is based on a matrix arranged in rows and columns and which includes, at the crossing of each row and each column, one display pixel. The system further comprises an arrangement of microelectronic sensors for pressure sensing, each sensor being based on one MOSFET transistor with a mobile gate being separated from the substrate by a cavity and further comprising means for measuring the position of the mobile gate and means for moving said mobile gate in response to the application of pressure.

In one particular embodiment, the display system is of Liquid Crystal Display or a Light Electroluminescent Diode (LED) or OLED.

BRIEF DESCRIPTION OF THE SEVERAL VIEWS OF THE DRAWINGS

Other features of one or more non-limiting and non-exhaustive embodiments will best be understood by reference to the following detailed description when read in conjunction with the accompanying drawings.

As it is known in the representation of microelectronic components, the diverse drawings are not illustrated with the proper scale. In the various drawings, the same reference numerals were used for referring to the same components.

DETAILED DESCRIPTION

Figure 1:
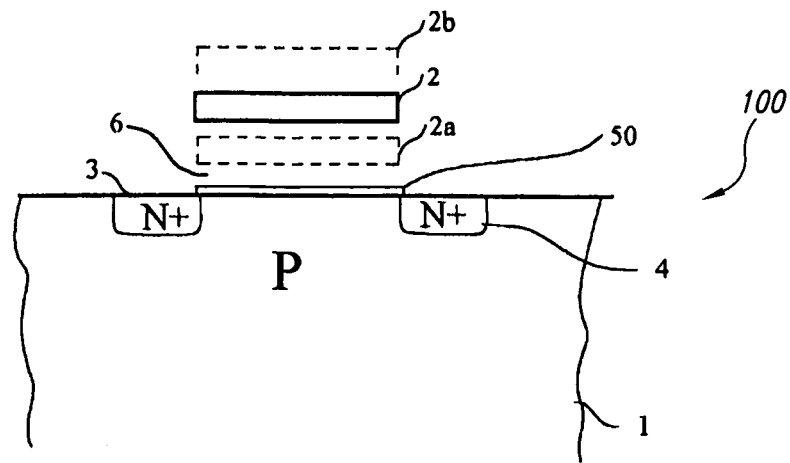
FIG. 1 illustrates a mobile gate transistor.

FIG. 1 shows a MOSFET transistor 100 having an N channel and a mobile gate. This transistor is formed on a P-type silicon substrate 1. A gate 2 formed of conductive material is located close to the surface of the silicon and is electrically isolated from substrate 1. Source and drain junctions 3 and 4, being of N+ type heavily doped, are located, in the silicon substrate, at the border of the gate. The substrate 1, the gate 2, source and drain junctions 3 and 4, respectively, constitute a N type MOSFET transistor. Any other type of semiconductor substrate (silicon, germanium, etc. . . . ) and any type of doping (N or P) which may serve to carry out a MOSFET transistor having a control gate may be used. Gate 2 of the transistor is separated by a cavity 6 which is made up of an isolator, made of gas or vacuum. The gate of this transistor is attached to the substrate at one of its ends in order to constitute a flexible elastic gate structure. In response to forces being applied to the gate, and also thanks to the flexibility of the gate structure, the cavity 6 between gate 2 and the surface of substrate 1 may vary.

In FIG. 1, two different positions of the same gate 2 are illustrated in dotted lines. The position 2a corresponds to the gate 2 being closer to the surface of substrate 1, while position 2b shows the same gate 2 being more distant from said substrate 1.

Gate 2 may take a particular shape of a rectangle or a beam having sides with lengths equal to L and Z. L corresponds to the distance between source and drain. L is the length of the transistor while Z is the width of the rectangular transistor. A squared transistor suitable for one embodiment of the invention may have both values L=Z being equal, and selected with the range of 5 to 500 micrometers, and preferably between 10 and 100 micrometers.

When no pressure is exercised on gate 2, the distance between the conductive gate and the surface of the substrate is preferably comprised between 50 nm and 200 nm. When a force is applied on gate 2, that distance may be reduced to 5 nm or reach a value beyond 400 nm.

In order to avoid any risk of electrical contact between the gate and the surface of the substrate, the gate or the substrate may be covered with an isolation layer 50, such as silicon oxide having a thickness superior than 4 nm.

The working of an N-type MOSFET transistor fitted with a mobile gate complies with the classical working of a transistor. The application to gate 2 of a positive voltage with respect to the substrate causes the generation of an electrical field which is perpendicular to the surface of the silicon and having the direction from bottom to top. When this electrical field is sufficiently high, an inversion of the type of silicon at the surface which, in our example, becomes a type N silicon: substrate P shows at its surface the generation of a inversion channel of the type N silicon comprising a high density of electrons. The higher the electrical field, the higher the density of the electrons will be in the channel formed on the substrate of silicon. The density increases with the voltage being applied on the gate and also increases as the distance between the mobile gate and the substrate decreases. In accordance with the known working of MOSFET transistors, sources and drain regions 3 and 4 which are located on both sides of this channel, respectively, inject electrons within the N channel and collects electrons from the channel.

Figure 2:
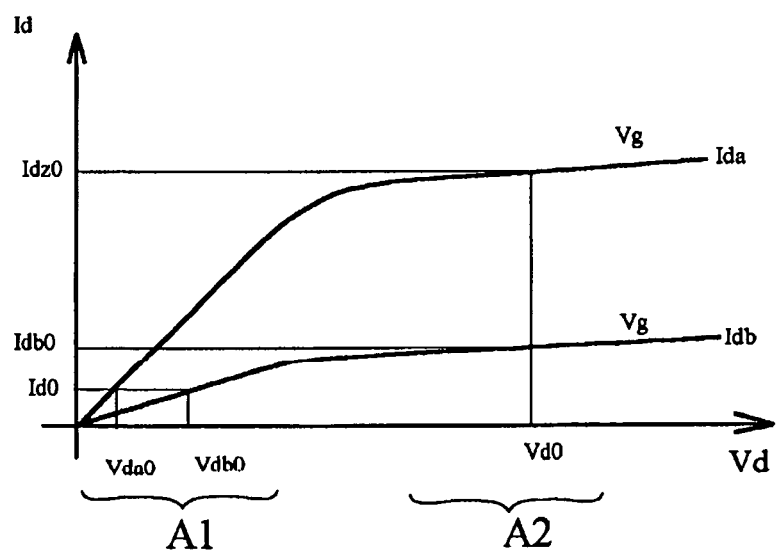
FIG. 2 shows the electrical characteristics of such a mobile gate transistor.

FIG. 2 shows the electrical characteristics of such a MOSFET transistor 100 fitted with a mobile gate. The source and substrate are set to the ground voltage. The gate is set at a positive voltage $V_g$, for instance equal to +2 volts, in order to form a channel and permit the transistor to become conductive. The drain voltage $V_d$ varies from 0 to 3 Volts and is represented on the x-x' axis. The drain current $I_d$ is shown on the y-y' axis. The two curves $I_{da}$ and $I_{db}$ which are illustrated in the figure are representative of the drain current corresponding to the close and distant position of mobile gate 2, respectively 2a and 2b, of the MOSFET transistor.

This curve $I_d$ as a function of $V_d$ is well known in the art of MOSFET transistors. For a high gate voltage which is associated with a low drain voltage, the working regime is that of an "ohm-type" regime: that is to say the drain current linearly increases with the drain voltage (region A1 of FIG. 2). For a low gate voltage combined with a high drain voltage, the working regime is a saturated one: the drain saturation current is roughly constant as a function of the drain voltage which is applied (region A2 in FIG. 2).

For a fixed gate voltage, the saturation current which is measured within region A2 increases when the gate is getting closer to the substrate (position 2a). The application of a voltage $V_{d0}$ to the drain results in a drain current $I_{da0}$ or $I_{db0}$ which is representative of the position 2a or 2b of gate 2. Any intermediary position between positions 2a and 2b, respectively, can be measured. In other words, the measurement of the drain current allows the determination of the distance between the gate and the substrate.

In region A1 and for a fixed gate voltage, the slope of the line representative of the drain current as a function of the drain voltage increases when the gate is getting closer to the substrate (position 2a). When one forces a current $I_{d0}$ to flow through the drain, there results a drain voltage $V_{da0}$ or $V_{db0}$ representative of the position 2a or 2b of gate 2. Any intermediary position between positions 2a and 2b, respectively, can be measured. In other words, the measurement of the drain current allows the determination of the distance between the gate and the substrate.

Figure 3A:
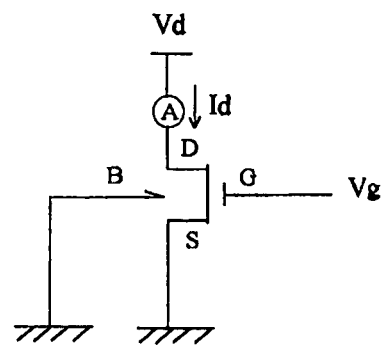
FIGS. 3a and 3b illustrate equivalent electrical schematics of a mobile gate transistor.
Figure 3B:
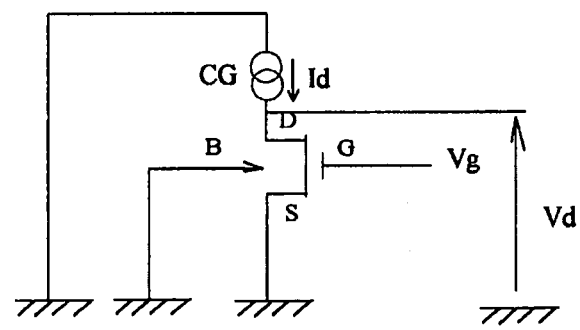

FIGS. 3a and 3b are electrical schematics which illustrate the measurements discussed above. FIG. 3a illustrates the N-type mobile gate MOSFET transistor 100 biased in the saturation region A2. The source S and the substrate B are connected to the ground and to a voltage $V_s$ and $V_b$ set to 0 volts. The drain D and the gate G are set at positive voltages, respectively $V_d$ and $V_g$. The measurement of the current flowing through the drain by means of a current measurement device A provides with the value of the drain current $I_d$ and, consequently, leads to the determination of the distance from the gate to the substrate.

FIG. 3b illustrates the N-type mobile gate MOSFET transistor 100 biased in a ohm-type region A1. Source S and substrate B are connected to the ground, to a voltage null $V_s$ and $V_b$. The drain D is connected to a current generator CG which forces a current $I_d$ to flow within the drain of the MOSFET transistor. The gate G is set at a positive voltage $V_g$. The measurement of the drain voltage $V_d$ allows the determination of the distance from the gate to the substrate.

The man skilled in the art knows how to integrate within a P substrate a current measurement circuit or a current generation using MOSFET transistors having fixed gates. The two examples of the measurement described above are examples provided for the sake of clarity. Once the mathematical model which is representative of the mobile gate transistor is determined, with the parameter of the distance from the gate to the substrate, one can determine, for each operating point of the parameters $V_s, V_g, V_d, V_b, I_d$, the unique position of the mobile gate. Such a mathematical model allows the measurement of the gate distance as a function of the electrical parameters which can be measured on the transistor. The mathematical model and its use can be stored and integrated within the same integrated circuit which already comprises the mobile gate transistors. The measurement of the distance from the mobile gate to the substrate is thus made in situ the electronic chip which comprises both the pressure micro-sensor and the associated control logic.

Figure 4A:
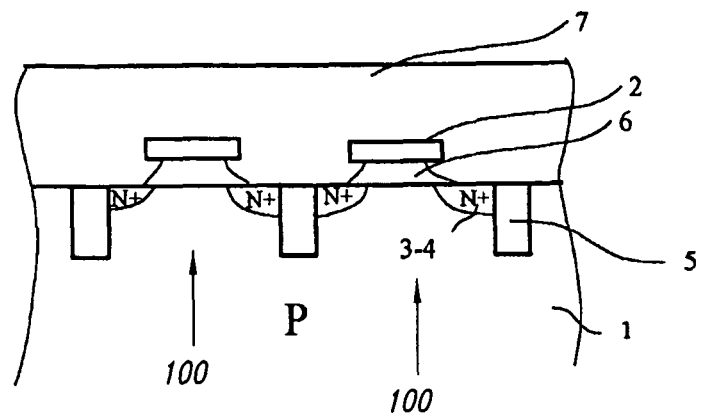
FIGS. 4a and 4b illustrate a pressure sensor in accordance with one embodiment of the invention.

FIG. 4a illustrates one embodiment of a microelectronic pressure sensor. On a P-type silicon substrate 1 are located several transistors 100 with mobile gates 2. The length of the gates has a value comprised within the range of 5 and 500 micrometers. Those gates have a distance of about 50 to 200 nm to the substrate. The source and drain regions 3 and 4—being of N+ type—are formed on the substrate, on either side of mobile gate 2. An isolating region 5, for instance a trench filled with oxide, surrounds the transistors. The dimension of diffusions N+ 3 and 4 and that of the trenches 5 are adapted to the manufacturing process used for fabricating the integrated circuits. The mobile gate transistors are covered with a silicone gel 7 having a thickness between 10 and 300 micrometers. As an example, company Dow Corning provides gels under the reference WL-3010 WL-5150 WL-5350 and WL5351, which are marketed under the form of a paste or that of a liquid. The viscosity of the liquid can be chosen so as to avoid that the gel fills the cavity 6 between mobile gate 2 and substrate 1. Preferably, the viscosity will be selected so as to permit gel 7 to lay on isolating regions 5 or on source and drain region 3-4. The Young modulus of silicone gels being used preferably is low, for example, smaller than 400 MPa.

Figure 4B:
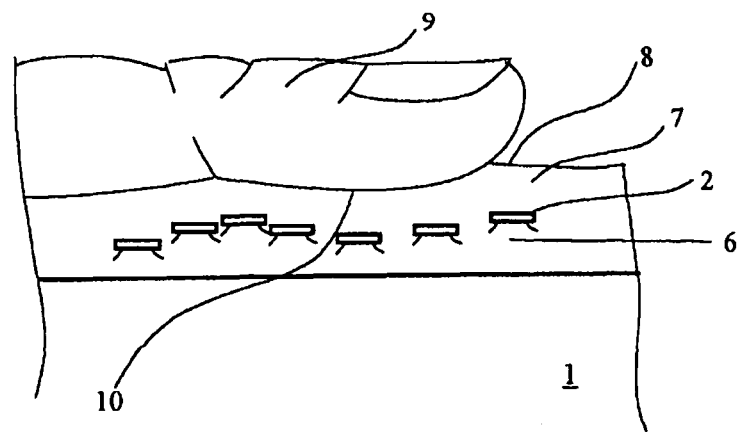

With respect to FIG. 4b, there is illustrated the working of the microelectronic pressure sensor as shown in FIG. 4a. Mobile gates 2 are formed and separated from the substrate by cavity 6. The silicone gel 7 covers the whole set of mobile gates and shows a top surface 8 on which is applied the relief of one body such as, for instance, one finger 9. The interface 10 between finger 9 and the surface of the silicone gel reproduces the relief of the finger. Indeed, thanks to the low value of the Young modulus of the silicone gel, there is provided a local and elastic modification of the thickness of the gel under the fingerprint pressure. Such modification is mechanically transmitted to the mobile gates which, in their turn, reproduce the profile of the fingerprint. The cohesion of the whole structure is ensured by the adhesive property of gel 7 covering mobile gates 2 and also by the preferential filling of the cavity between mobile gates 2. This filling can also impact the peripheral of cavity 6 between the gate and the substrate. The elasticity of the displacement of gate 2 results from the elasticity of the silicone gel which holds together the mobile gates 2. The resistance to such distortion is weak and can be adjusted in accordance with the Young Modulus of the silicone gel being used. The measurement of the distance between the gates and the substrate allows the capture of the finger roughness characterizing the fingerprint. When the finger is removed from the surface, gates 2 come back to their initial position and a new fingerprint capture may be considered.

Figure 5:
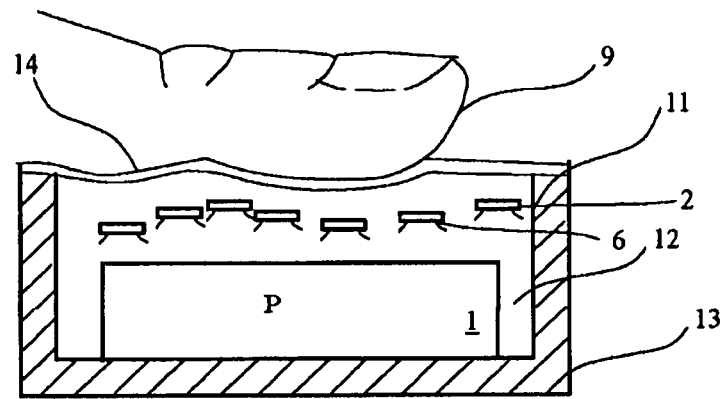
FIG. 5 illustrates a pressure sensor in accordance with an alternative embodiment.

FIG. 5 illustrates an alternative embodiment of a microelectronic pressure sensor. On a substrate 1 of P-type silicon are formed several transistors, each having a mobile gate 2. The length of the gate is between 5 and 500 microns. When no pressure is being exercised, the distance apart from the gates to the substrate is between 50 to 200 nm. Gates are separated from the substrates by cavities 6. The substrate supporting the mobile gate transistors 2 is located inside a cavity 12 being delimited at its bottom and at its two sides by a material 13. The upper part of the cavity is delimited by a membrane 11 which is substantially planar and parallel to the substrate. The surface of the membrane is about 1 cm². The distance between that membrane and gates 2 is between 50 and 5000 microns, and preferably within the range of 200 and 500 microns. That membrane is made, for instance, of synthetic material such as polymer. It is tight and elastic and is likely to distort in response to a mechanical stress. The membrane is made of an electrically conductive element or, alternatively, can be covered by a layer of conductive material laid on one of its surface. For instance, the incorporation of carbon or alternatively metal in the polymer film achieves electrical conductivity without jeopardizing its mechanical properties. The cavity is filled with a gas under the atmospheric pressure in order to avoid any distortion of the membrane at the atmospheric pressure. On one portion 14 of the external surface of the membrane closing the cavity one finger 9 is being applied in the drawing. The pressure which is exercised by the finger causes an elastic and local distortion of the membrane which, therefore, reproduces the fingerprint. The properties of the membrane, i.e., the elasticity and the tension of the latter are such that there are no permanent distortion of the membrane which, moreover, is not in contact with the mobile gates 2.

Mobile gates are set to a positive voltage, for instance 3 volts while the membrane is set to a voltage equal to 0 volts. The difference of voltage between the membrane and gate 2 generates an electrostatic force that draws the gate towards the membrane. This results in the bending of gate 2 towards the membrane. This bending remains however limited by the elastic force resulting from the attachment of the gate on the substrate. The local distortion of the membrane is thus transmitted to the mobile gates by means of an electrostatic force. Those mobile gates reproduce the profile of the fingerprint. The measure of the distance of the mobile gates to the substrate thus allows the capture of the profile of the fingerprint.

Any other force which may be applied at distance can be used. In particular, the electromagnetic forces or the magnetic forces can be used for that purpose. For instance, a current flowing through the mobile gates which or a region located within the membrane creates an electromagnetic force on the mobile gates 2. Ferromagnetic materials can be introduced in the membrane as well as in the gates in order to produce magnetic fields.

Figure 6:
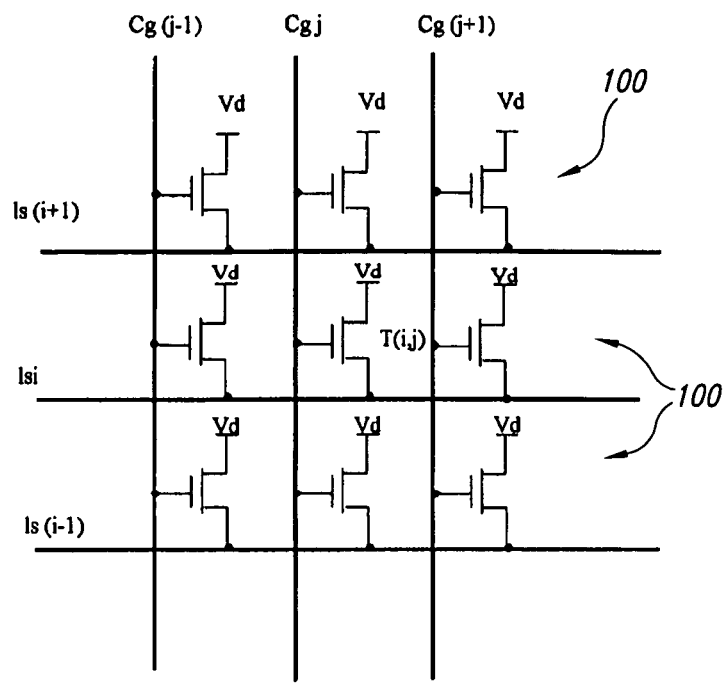
FIG. 6 shows a matrix of mobile gate transistors.

FIG. 6 illustrates an electrical schematic of a matrix $M_{nm}$ of mobile gate transistors 100 which is suitable for the sensing and the recognition of a fingerprint, that is to say to recognize the particular pattern created by the relief of the skin or that of a finger.

In FIG. 6, the mobile gate transistors 100, such as those illustrated in FIGS. 4a and 4b and 5, are arranged in a matrix $M_{nm}$ of transistors having n rows $I_i$ (i varying from 1 to n) and m columns $C_j$ (j varying from 1 to m). The surface of matrix $M_{nm}$ is inferior than 1 cm$^2$ and may comprise about 200 mobile gate transistors. A higher number of transistors may be considered, but is generally not required for the recognition of a fingerprint. If the transistors are evenly spaced from one another within the considered surface of 1 cm$^2$, two subsequent transistors are 0.7 mm apart, what is sufficient for sensing the rough patch of a finger. 200 consecutive measurements of the finger rough patch may serve for achieving a satisfactory capture of a fingerprint.

It is assumed that all the transistors of the matrix $M_{nm}$ are N channel mobile gate MOSFET transistors. The drains of all the transistors are electrically connected and biased to a positive voltage $V_d$. An electrically conductive circuit or row $I_{si}$ connects the sources of all transistors $T_{(i,j)}$ of one given row i. A electrically conductive column $C_{gj}$ achieves the connection of all the gates of transistors $T_{(i,j)}$ belonging to a same column j.

The voltage of the substrate of transistors is taken as a reference voltage. The measurement of the position of the gate of the transistor belonging to the ith row and the jth column ($T_{(i,j)}$) is performed, in accordance with the method which was discussed above, in relation to FIG. 3a:

One sets to ground voltage all the gates of the transistors with the exception of the transistors which are connected to the conductive column $C_{gj}$. $C_{gj}$ is biased to a positive voltage instead.

One performs the measurement of the current flowing through the connecting line $I_{si}$.

This current is the current which passes through transistor $T_{(i,j)}$, the other transistors belonging to the same row being blocked. This current allows the measurement and the determination of the distance from the mobile gate to the substrate of transistor $T_{(i,j)}$.

This matrix $M_{nm}$ is covered by a silicone gel 7 which was described in reference to FIG. 4a or, alternatively, is covered by a membrane 11 as discussed above in relation to FIG. 5.

The matrix embodies a microelectronic sensor which has a surface of 1 cm$^2$ and which includes a set of 200 individual sensors. This microelectronic sensor is suitable for measuring the profile of a surface being applied. It is particularly useful for achieving the sensing of a fingerprint and for producing a corresponding representative electrical information.

The number of individual measuring sensors can be adapted in accordance with the particular profile of the surface to be sensed.

The mobile gate transistors may be of N or P type, the skilled man being capable of adjusting the biasing as well as the sign of the voltages to apply in order to perform the measuring of the distance between the gate and the substrate. The decoding of matrix $M_{nm}$, by row and column, is only given as an example.

Any other type of decoding may be used. Integrated memory circuits, Dynamic Random Access Memory (DRAM) for instance, provide a great number of examples which may serve for achieving the decoding operation of a matrix made up of MOS transistors. As explained above, the position of the gate can be determined by a measurement of the drain voltage.

It was assumed that all the transistors are formed on a single P type substrate. MOSFET transistors having a N channel may also be realized in separated P-wells being isolated from a N-type substrate. The selection of the decoded transistors can be achieved by the biasing of the P-well (instead of biasing the gate) so as to modify the threshold voltage of the transistors. For a gate voltage which is positive, a MOS transistor can be switched to a non-conductive state by means of a negative voltage being applied on the well of said transistor. The threshold voltage increases and when it reaches the value of the gate voltage, the transistor switches to the non-conductive state. In this operating mode which is proposed, all the gates are identically biased, what is desirable in some proposed embodiments, particularly when the force being applied on the gates is an electrostatic force generated by the difference of voltage between the gates and the membrane shown in FIG. 5.

Figure 7:
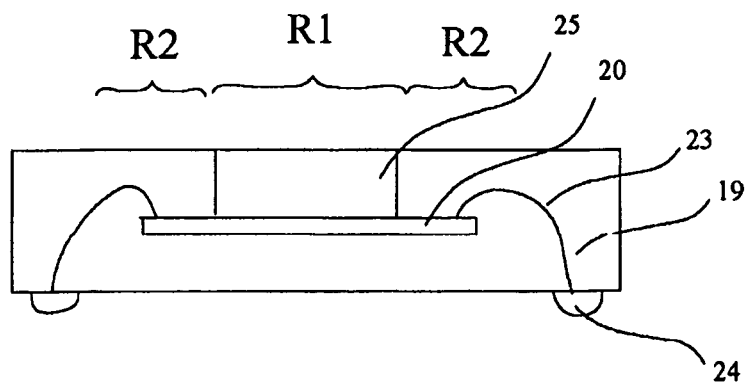
FIG. 7 shows the package of an integrated circuit including a pressure sensor.

FIG. 7 illustrates a package 19 of an electronic chip 20. That electronic chip 20 comprises two main regions, R1 and R2. The microelectronic pressure sensor is realized in the first region R1. The second region R2 serves for the embodiment of all the usual electrical functions which can be usually manufactured into one integrated semiconductor product. Particularly, the functions for addressing and decoding the information produced by the microelectronic sensor. Advantageously, those functions may include the data capturing, the recognition process and the exploitation of the fingerprint. Modules used for the transfer of the information can also be provided in order to allow communication between chip 20 with external circuits outside the chip. There should be no limitation in the functions provided by this chip 20 which constitutes a System On Chip (SOC). Usually, chip 20 is connected to contacts 24 which are located at the exterior of package 19 by means of conductive wires 23. Package 19 comprises a cavity 25 which is located above region R1 and which opens on the mobile gates of the microelectronic pressure sensor of region R1. In accordance with the embodiments shown in FIGS. 4b and 5, this cavity is filed with a silicone gel 7 or closed at its top side by a membrane 11 which is substantially parallel to the surface of the electronic substrate 20. The surface of the profile to be measured is applied on the package at the right side of cavity 25.

Such microelectronic pressure sensors can be used in various apparatus. As non limitative examples, one may consider:
Mechanical Action
Touch sensitive screen for entering information.
System Safety:
Fingerprint recognition process by the user of one system. Combination of One Mechanical Action with a User Signature or any Other Security Process.

The microelectronic pressure sensors which were described are compatible with the techniques of manufacturing flat screens. One user may thus input data on this flat screen by means of his fingers. The screen achieves the recognition of the position of the finger on the screen, or the capture of the pressure exercised by it. Simultaneously there is provided the recognition of the fingerprint of the user as well as a security check in order to ascertain that the user is assigned the proper rights for the operation being considered. The data which is input by the user can thus be automatically signed by him or her.

The microelectronic pressure sensor is able to recognize any profile of seal, pattern or cameo. The system is able to recognize the profile of this specific mechanical key.

In one particular embodiment, the microelectronic sensors described above can be integrated in a flat panel display so as to cooperate with active circuits allowing the display of colors on the panel in order to achieve a touch sensitive screen.

Figure 8:
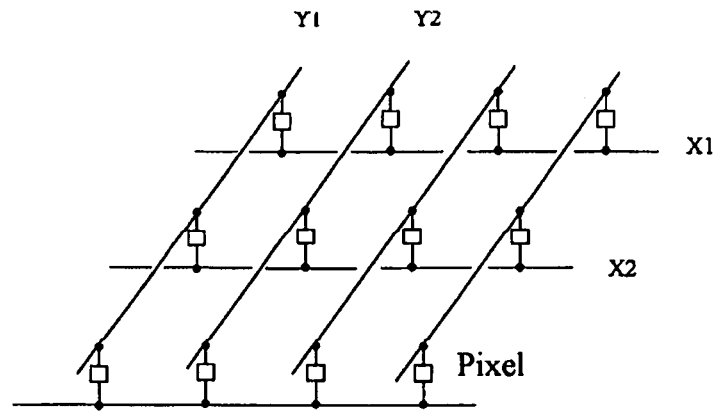
FIG. 8 illustrates the structure of a planar display which is arranged in a matrix which can use a set of microelectronic sensors in accordance with one embodiment so as to carry out a finger controllable planar display system.

To achieve this, there is provided a flat display system which is known in the art, and which comprises electrodes being arranged in a matrix comprising rows and columns. At the intersection of every row and every column, there is provided one individual cell which displays one pixel, as shown in FIG. 8.

Figure 9:
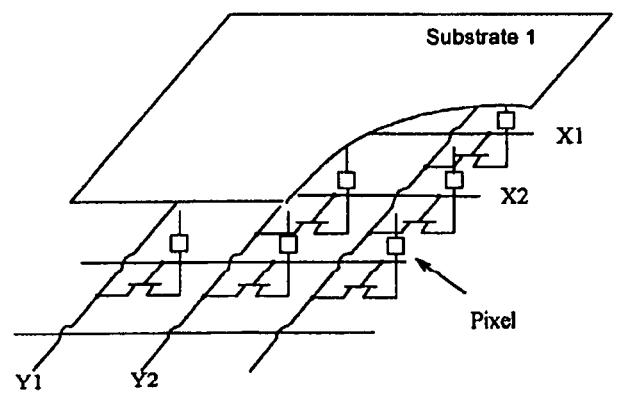
FIG. 9 illustrates the structure of a display based on a matrix arranged in rows and columns.

Alternatively, as illustrated in FIG. 9, the activation of every pixel is achieved by means of a thin film transistor (TFT), the latter being used as a switch. As shown in the Figure, a substrate 1 is arranged above the display and comprises the microelectronic sensors which were described above so as to achieve a touch sensitive screen.

Generally speaking, any display technique which is based on a matrix of cells arranged in rows and columns may be used in combination with the microelectronic sensors discussed above in order to meet with appropriate requirements.

In one particular embodiment, one may use a liquid crystal display (LCD) based on organic molecules directing the light along one axis in response to the application of one magnetic filed, the cells being located between two polarization filters having perpendicular axes.

Alternate display processes can be used with the embodiments which were described. The microelectronic sensor which was discussed above can be used with organic light emitting diodes (OLED) or also with light emitting diode (LED) displays providing three-color pixels arranged in a matrix of rows and columns.

The invention is further compatible with the more recent manufacturing techniques of microelectronics, and more particularly with MEMS (Micro Electro Mechanical System) such as, for instance, Digital Mirror Device (DMD) mirrors which can be combined with the embodiment in order to provide a flat touch sensitive screen.

By combining the flat touch sensitive screen which was described above with a process for recognition of fingerprints, one may also provide a selective or contextual display in the case of sensitive applications.

The various embodiments described above can be combined to provide further embodiments. All of the U.S. patents, U.S. patent application publications, U.S. patent applications, foreign patents, foreign patent applications and nonpatent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectronic pressure sensor, comprising:
a substrate;
a MOSFET transistor including:
source and drain regions in the substrate;
a channel between the source and drain region in the substrate;
a mobile gate formed from a first material over the channel, the mobile gate having an upper surface and sidewalls; and
a first cavity that separates the mobile gate from the channel; and
a gate actuator formed from a second non-conductive material that is different from the first material, the gate actuator being formed above the mobile gate, the gate actuator being in contact with the upper surface and sidewalls of the mobile gate, an upper surface of the gate actuator being configured to receive a pressure from a physical object and to move said mobile gate toward the channel in response to the pressure on the upper surface of the gate actuator, the upper surface of the gate actuator being separated from the cavity by the mobile gate, the gate actuator being an elastic material that has a thickness between the upper surface of the mobile gate and the upper surface of the gate actuator, the thickness of the gate actuator being configured to vertically compress in a plurality of locations in response to the pressure, the plurality of locations corresponding to a plurality of locations on the object.

2. A microelectronic pressure sensor according to claim 1 wherein said gate actuator includes a silicone gel in direct contact with the upper surface and the sidewalls of the mobile gate, the upper surface of the gate actuator being a top surface of the silicone gel that is configured to convert the pressure applied by the object to a mechanical movement of the mobile gate.

3. A microelectronic pressure sensor according to claim 2 wherein the gel is configured to adhere to the upper surface of the mobile gate and to the sidewalls of the mobile gate, the gel is also configured to adhere to the substrate to form the first cavity between the substrate and the mobile gate.

4. A microelectronic pressure sensor according to claim 1 wherein said gate actuator comprises a membrane formed on the gate actuator and spaced from the mobile gate by a variable distance, the membrane being configured to distort under application of the pressure and to generate an electrostatic or electromagnetic force that affects said mobile gate, the force varying in accordance with the distance from said membrane to said mobile gate.

5. A microelectronic pressure sensor according to claim 4, further comprising:
a support that includes a base and sidewalls extending from the base, the base and sidewalls enclosing a second cavity, the substrate being on the base in second cavity, the second cavity being closed by said membrane, wherein said membrane is in contact with the sidewalls and is elastic, conductive and configured to be biased with respect to said mobile gate.

6. A microelectronic pressure sensor according to claim 1 wherein said MOSFET transistor is a N channel transistor and the substrate is a P type monocrystalline silicon substrate.

7. A microelectronic pressure sensor according to claim 1, further comprising measuring means configured to measure a position of said mobile gate with a mathematical model of electrical characteristics of the MOSFET transistor, said model having parameters set in accordance with the position of said mobile gate, said measuring means being configured to capture an electrical working point of said transistor and determine the position of the gate from the model parameters and from the capture of the working point.

8. A microelectronic pressure sensor according to claim 7 wherein the transistor is one of a matrix of MOSFET transistors having mobile gates.

9. A microelectronic pressure sensor according to claim 8, wherein said matrix includes about 200 MOSFET transistors evenly spaced apart from each other.

10. A microelectronic pressure sensor according to claim 8 wherein the matrix is located in a first region of an integrated chip, said chip further comprising a second region including electronic circuits configured to determine a relative position of every mobile gate with respect to the substrate, to process said position and to interface with circuits located outside of said chip.

11. A microelectronic pressure sensor according to claim 10, further comprising a package supporting said chip, the package comprising a second cavity opening on said matrix, wherein the gate actuator includes a silicone gel on top of the mobile gates and in mechanical contact with said mobile gates, the upper surface being a top surface of the silicone gel that is configured to convert the pressure applied by the mechanical contact to a mechanical movement of said mobile gates.

12. A microelectronic pressure sensor according to claim 10, further comprising a package supporting said chip, the package comprising a second cavity opening on said matrix, the gate actuator including a membrane that closes the second cavity and is substantially parallel to a surface of said chip.

13. A microelectronic pressure sensor according to claim 1 wherein the gate actuator has interior walls that define sidewalls of the first cavity, the interior walls configured to compress in response to the pressure on the gate actuator.

14. A process, comprising:
measuring contours of a first surface of a body, the measuring including:
moving mobiles gates of MOSFET transistors towards a channel of each transistor in response to pressure locally exercised on an upper surface of a gate actuator by the first surface of the body, the gate actuator being a first material, the first surface being above the upper surface of the gate actuator, the gate actuator being formed above the mobile gates, the mobile gates being a second non-conductive material that is different from the first material, the mobile gates each having an upper surface and sidewalls, the gate actuator being in contact with the upper surface and sidewalls of the mobile gates, the transistors each including a cavity that separates the mobile gate from the channel of the transistor, the upper surface of the gate actuator being separated from the cavity by the mobile gate, the gate actuator being an elastic material that has a thickness between the upper surface of the mobile gate and the upper surface of the gate actuator, the thickness of the gate actuator being configured to vertically compress in a plurality of locations in response to the pressure, the plurality of locations corresponding to a plurality of locations on the body; and
converting the movement of the mobile gates that correspond to the plurality of locations into electrical quantities that correspond to relative distances between the mobile gates and the channels.

15. A process according to claim 14, wherein said body is a finger and the contours to be measured correspond to a fingerprint of the finger.

16. A process according to claim 15, further comprising:
processing the electrical quantities in an electronic chip that includes the transistors; and
extracting the fingerprint from the electrical quantities.

17. A process according to claim 14, wherein the gate actuator is a silicone gel, the upper surface of the gate actuator being a top surface of the silicone gel, said moving includes using the silicone gel to move the mobile gates in response to the pressure exerted by the first surface of body.

18. A process according to claim 14 wherein said moving includes using a membrane to move the gate actuator to move mobile gates in response to the pressure exerted by the first surface of body.

19. A process for manufacturing a microelectronic pressure sensor, comprising:
forming a MOSFET transistor, the forming of the transistor including:
forming source and drain regions in the substrate;
forming a channel between the source and drain region in the substrate;
forming a mobile gate over the channel from a first material;
forming the mobile gate to have an upper surface and sidewalls; and
forming a cavity that separates the mobile gate from the channel; and
forming a gate actuator from a second non-conductive material that is different from the first material, the gate actuator being above the mobile gate, the gate actuator being in contact with the upper surface and sidewalls of the mobile gate, an upper surface of the gate actuator configured to receive a pressure from an object and to move said mobile gate towards the channel in response to a pressure on the upper surface of the gate actuator, the upper surface of the gate actuator being separated from the cavity by the mobile gate, the gate actuator being an elastic material that has a thickness between the upper surface of the mobile gate and the upper surface of the gate actuator, the thickness of the gate actuator being configured to vertically compress in a plurality of locations in response to the pressure, the plurality of locations corresponding to a plurality of locations on the object.

20. A process according to claim 19 wherein forming the gate actuator includes:
covering said MOSFET transistor and the gate actuator with an elastic membrane, the membrane being substantially tight, positioned parallel to said substrate, and being electrically conductive.

21. A process according to claim 20, further comprising coupling the membrane and the mobile gate with a voltage source configured to bias said membrane with respect to said mobile gate.

22. A process according to claim 19 wherein forming the gate actuator includes covering said MOSFET transistor with a gel having a Young modulus less than 400 Mpa.

23. A flat display system, comprising:
a matrix arranged in rows and columns and including pixels at crossings of the rows and columns, respectively; and
an arrangement of microelectronic pressure sensors formed on a substrate, the pressure sensors positioned between the matrix and the substrate, each microelectronic pressure sensor including:
a MOSFET transistor including:
source and drain regions in the substrate;
a channel between the source and drain region in the substrate;
a mobile gate of a first material formed over the channel, the mobile gate having an upper surface and sidewalls; and
a cavity that separates the mobile gate from the channel; and
a gate actuator formed of a second non-conductive material that is different from the first material, the gate actuator being formed above the mobile gate, the gate actuator being in contact with the upper surface and sidewalls of the mobile gate, an upper surface configured to receive a pressure from an object, the gate actuator configured to move the mobile gate towards the channel in response to the pressure on the upper surface, the upper surface of the gate actuator being separated from the cavity by the mobile gate, the gate actuator being an elastic material that has a thickness between the upper surface of the mobile gate and the upper surface of the gate actuator, the thickness of the gate actuator being configured to vertically compress in a plurality of locations in response to the pressure, the plurality of locations corresponding to a plurality of locations on the object.

24. A flat display system according to claim 23 wherein the gate actuator includes a silicone gel in direct contact with the upper surface and the sidewalls of said mobile gate, the upper surface of the gate actuator being a top surface of the silicone gel, the silicone gel being configured to impart a movement of said gate from the pressure applied on the upper surface of the gate actuator.

25. A flat display system according to claim 23 wherein each pixel is realized by a liquid crystal display cell.

26. A flat display system according to claim 23, wherein each pixel is realized by one or more electroluminescent diodes.

* * * * *